(12) United States Patent
Umeda et al.

(10) Patent No.: US 8,569,797 B2
(45) Date of Patent: Oct. 29, 2013

(54) FIELD EFFECT TRANSISTOR AND METHOD OF MANUFACTURING THE SAME

(75) Inventors: Hidekazu Umeda, Osaka (JP); Masahiro Hikita, Toyama (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/185,818

(22) Filed: Jul. 19, 2011

(65) Prior Publication Data

US 2011/0272740 A1 Nov. 10, 2011

Related U.S. Application Data

(63) Continuation of application No. PCT/JP2010/000232, filed on Jan. 18, 2010.

(30) Foreign Application Priority Data

Jan. 22, 2009 (JP) .................................. 2009-012228

(51) Int. Cl.
*H01L 29/80* (2006.01)
(52) U.S. Cl.
USPC ............ 257/192; 257/E21.403; 257/E29.246; 438/191
(58) Field of Classification Search
USPC ....................................................... 257/192
See application file for complete search history.

(56) References Cited

U.S. PATENT DOCUMENTS

| | | | |
|---|---|---|---|
| 6,201,269 B1 | 3/2001 | Takano et al. | |
| 7,816,707 B2 | 10/2010 | Hikita et al. | |
| 8,076,698 B2 | 12/2011 | Ueda et al. | |
| 8,269,327 B2* | 9/2012 | Leedy | 257/678 |
| 2005/0145851 A1* | 7/2005 | Johnson et al. | 257/76 |
| 2006/0273347 A1* | 12/2006 | Hikita et al. | 257/192 |
| 2007/0176215 A1 | 8/2007 | Yanagihara et al. | |
| 2008/0093635 A1 | 4/2008 | Kobayashi | |

(Continued)

FOREIGN PATENT DOCUMENTS

| CN | 101009325 A | 8/2007 |
|---|---|---|
| JP | 7-335666 | 12/1995 |

(Continued)

OTHER PUBLICATIONS

Chinese Office Action issued in Chinese Patent Application No. 201080005230.7 mailed on Jan. 31, 2013.

(Continued)

*Primary Examiner* — Julio J Maldonado
*Assistant Examiner* — Jaehwan Oh
(74) *Attorney, Agent, or Firm* — McDermott Will & Emery LLP

(57) ABSTRACT

A field-effect transistor includes a first semiconductor layer formed on a substrate, and a second semiconductor layer. The first semiconductor layer has a containing region provided as an isolation region which contains non-conductive impurities, and a non-containing region which contains no non-conductive impurities. A first region is defined by a vicinity of a portion of the interface between the containing region and the non-containing region, the portion of the interface being below a gate electrode, the vicinity including the portion of the interface and being included in the containing region. The second semiconductor layer includes a second region which is located directly above the first region. The concentration of the non-conductive impurities of the second region is lower than that of the first region.

19 Claims, 21 Drawing Sheets

(56) References Cited

U.S. PATENT DOCUMENTS

| | | |
|---|---|---|
| 2009/0121775 A1 | 5/2009 | Ueda et al. |
| 2009/0189188 A1* | 7/2009 | Matsushita .................. 257/192 |
| 2009/0278166 A1* | 11/2009 | Soeno et al. .................. 257/133 |
| 2010/0327293 A1 | 12/2010 | Hikita et al. |

FOREIGN PATENT DOCUMENTS

| | | |
|---|---|---|
| JP | 2005235935 A | 9/2005 |
| JP | 2006228891 A | 8/2006 |
| JP | 2006-339561 | 12/2006 |
| JP | 2007019309 A | 1/2007 |
| JP | 2008-108793 | 5/2008 |
| JP | 2008-166431 | 7/2008 |

OTHER PUBLICATIONS

Japanese Office Action issued in Japanese Patent Application No. 2010-547430 mailed on Aug. 6, 2013.

* cited by examiner

FIELD EFFECT TRANSISTOR AND METHOD OF MANUFACTURING THE SAME

CROSS REFERENCE TO RELATED APPLICATION

This is a continuation application of PCT application No. PCT/JP2010/000232 filed on Jan. 18, 2010, designating the United States of America.

BACKGROUND OF THE INVENTION (1) Field of the Invention

The present invention relates to a field effect transistor using a nitride semiconductor and a method of manufacturing the field effect transistor that can be applied to, for example, a power transistor used in a power supply circuit or the like of a consumer product.

(2) Description of the Related Art

The group III nitride semiconductor represented by gallium nitride (GaN) is a wide-gap semiconductor, for which the band gaps of gallium nitride (GaN) and aluminum nitride (AlN) are wide, for example, 3.4 eV and 6.2 eV at room temperature, respectively, thus has a feature of high breakdown electric field and a higher electron saturation velocity than that of gallium arsenide (GaAs), silicon (Si) and the like. For this reason, field effect transistors (FET) as electronic devices for high-frequency or electronic devices for high-output using GaN-based material are now being actively researched and developed.

Nitride semiconductor material such as GaN can be mixed with AlN or indium nitride (InN) to form various mixed crystals, and thus can form a heterojunction similarly to the conventional arsenic-based semiconductor material such as GaAs. The heterojunction of a nitride semiconductor, for example, AlGaN/GaN heterostructure has such a characteristic that high concentrations of carriers occur at the hetero-interface due to spontaneous polarization and piezo polarization even in a state where the heterostructure is not doped with impurities. Consequently, in the case where an FET is made of nitride semiconductor material, the FET tends to be depletion type (normally-on), and tends not to be enhancement type (normally-off). However, most devices currently used in the power electronics market are normally-off, and normally-off devices are highly demanded for GaN-based nitride semiconductor devices.

A method of achieving a normally-off transistor has been reported by constructing a structure, in which the AlGaN layer in the AlGaN/GaN structure is made thinner only in its portion underlying the gate electrode, i.e., a recess structure is formed so that two-dimensional electron gas (2DEG) concentration is reduced to shift a threshold voltage to a positive value, or by growing a GaN layer having the plane orientation of the {11-20} plane on the principal surface of a sapphire substrate having the plane orientation of the {10-12} plane so that a polarized electric field is not generated in the direction perpendicular to the principal surface of the sapphire substrate. Here, the minus sign assigned to the Miller indices of the plane direction expediently indicates the inversion of the index following the minus sign.

As a promising structure for normally-off FET, Junction Field Effect Transistor (JFET) in which p-type AlGaN layer is formed in the gate electrode part has been proposed.

FIG. 10A is a sectional view of a field-effect transistor including a normally-off nitride semiconductor in the conventional art (for example, see Japanese Unexamined Patent Application Publication No. 2006-339561, hereinafter referred to as Patent Reference 1). FIG. 10A is a sectional view of a gate electrode, a source electrode, and a drain electrode in their alignment direction.

This field-effect transistor includes an AlN buffer layer 502, an undoped GaN layer 503, an undoped AlGaN layer 504, a p-type GaN layer 505, a high-concentration p-type GaN layer 506 that are sequentially formed on a sapphire substrate 501, and a gate electrode 511 is ohmic-contacted to the high-concentration p-type GaN layer 506. A source electrode 509 and a drain electrode 510 are provided on the undoped AlGaN layer 504. In order to separate the field-effect transistor from other external circuits, an isolation region 507 is provided around the peripheral portion (circumference) of the field-effect transistor.

FIG. 11A is an energy band diagram in the vertical section of the gate region of the field-effect transistor, and FIG. 11B is an energy band diagram in the vertical section between the gate region and the source region.

The hetero-interface between the undoped AlGaN layer 504 and the undoped GaN layer 503 forms a junction between two undoped layers, and a groove is formed in the conduction band as shown in FIGS. 11A and 11B due to the electric charge caused by spontaneous polarization and piezo polarization. On the other hand, as shown in FIG. 11B, the groove of the conduction band is at a level lower than the Fermi level because the p-type GaN layer 505 is not connected on the undoped AlGaN layer 504 in the active regions other than the gate region, thus two-dimensional electron gas is formed even in a state where the gate voltage is not applied. However, the energy levels of the undoped AlGaN layer 504 and the undoped GaN layer 503 are raised in the gate region as shown in FIG. 11A due to the connection of the p-type GaN layer 505 to the undoped AlGaN layer 504, thus the groove of the conduction band in the hetero-interface between the undoped AlGaN layer 504 and the undoped GaN layer 503 is at almost the same position as the Fermi level. Consequently, in the state where a bias is not applied to the gate electrode, no two-dimensional electron gas is formed in the gate region, thus the FET is in the normally-off state.

In this manner, the potential energy of the AlGaN layer is raised by connecting the p-type GaN layer to a barrier layer including AlGaN in the JFET structure. Accordingly, the concentration of the two-dimensional electron gas formed directly below the gate electrode part where the p-type AlGaN layer is formed can be reduced, thus the JFET can achieve normally-off operation. Also, a p-n junction having a built-in potential greater than that of Schottky junction for jointing a metal and a semiconductor is used in the gate electrode part, thus the rising voltage of the gate can be increased.

Here, AlGaN represents $Al_xGa_{1-x}N$ (where 0<x<1); InGaN represents $In_yGa_{1-y}N$ (where 0<y<1); InAlGaN represents $In_yAl_xGa_{1-x-y}N$ (where 0<x<1, 0<y<1, and 0<x+y<1). This notation also applied to the following.

SUMMARY OF THE INVENTION

However, the JFET including the conventional nitride semiconductor has a problem of a large leakage current and a reduced OFF-breakdown voltage in the off-state of the transistor.

FIG. 10B is a sectional view of a reference embodiment of the present invention, produced by the inventors.

FIG. 10B is a sectional view of the gate electrode, the source electrode, and the drain electrode in the direction perpendicular to their alignment direction. However, FIG. 10B shows only the right half of the portion just below the gate electrode.

When specifically described using FIG. 10B, a leakage current occurs at one end of the hetero-interface below the gate out of the ends of the hetero-interface between the undoped AlGaN layer 504 and the undoped GaN layer 503. In other words, the leakage current occurs at the portion below the gate, where the isolation region 507 and the one end of the hetero-interface are in contact with each other. The leakage current path below the gate forms a leak path between the source electrode and the drain electrode through the hetero-interface.

The reason why the leakage current occurs is considered to be that in the portion below the gate where the isolation region 507 and the one end of hetero-interface are in contact with each other, the bandgap energy when the transistor is OFF is in an intermediate state (a state where electrons exist without being depleted) between the states in FIG. 11A and FIG. 11B. That is to say, it is considered that in the one end of the hetero-interface below the gate, the p-type GaN layer 505 cannot sufficiently raise the energy levels of the undoped AlGaN layer 504 and the undoped GaN layer 503, thus the two-dimensional electron gas cannot be completely depleted.

Also, in the case where the field-effect transistor is used as a power transistor, heat generation due to the leakage current is high, and consequently, the OFF-breakdown voltage is reduced.

In view of the above-mentioned existing problems, an object of the present invention is to provide a field-effect transistor as a normally-off semiconductor device including a nitride semiconductor, which allows the leakage current in OFF state to be suppressed and the OFF-breakdown voltage to be increased.

In order to solve the aforementioned problems, the field-effect transistor of the present invention includes a substrate; a first semiconductor layer including a plurality of semiconductor layers stacked on the substrate, and including a channel; a source electrode and a drain electrode which are formed on the first semiconductor layer; a gate electrode; and a second semiconductor layer formed on the first semiconductor layer and below the gate electrode, the second semiconductor layer having a conductivity type opposite to a conductivity type of the channel, wherein the first semiconductor layer has a containing region which contains non-conductive impurities, and a non-containing region which does not contain non-conductive impurities, the containing region has an increased resistance by including the non-conductive impurities, the increased resistance being higher than a resistance of the non-containing region, the first semiconductor layer includes a first region, the first region is defined by a vicinity region of a portion of an interface between the containing region and the non-containing region, the portion of the interface being directly below the second semiconductor layer, the vicinity region including the portion of the interface and being included in the containing region, the second semiconductor layer includes a second region, the second region is located directly above the first region, and a concentration of the non-conductive impurities of the second region is lower than a concentration of the non-conductive impurities of the first region.

With this configuration, a normally-off field-effect transistor having a small leakage current and a high OFF-breakdown voltage can be achieved. This is because the second region has a conductivity type opposite to that of the channel, and has the concentration of the non-conductive impurities lower than that of the first region. That is to say, the second region has the conductivity characteristics opposite to that of the channel. Therefore, in the case where the channel is formed with electrons and the second semiconductor layer is p-type, the second region can sufficiently raise the energy level of the channel at the end (the area where the channel collides with the interface between the containing region and the non-containing region) below the second semiconductor layer in a similar manner how the energy level of the channel is raised. Also, in the case where the channel is formed with holes and the second semiconductor layer is the n-type semiconductor, the second region can sufficiently lower the energy level of the channel at the end below the second semiconductor layer in a similar manner how the energy level of the channel is lowered. Thereby, occurrence of leakage current at the end of the channel below the gate electrode can be suppressed. Also, in the case where the field-effect transistor is used as a power transistor, heat generation due to the leakage current is suppressed, thus the OFF-breakdown voltage can be increased.

Because the second semiconductor layer below the gate electrode has a conductivity type opposite to that of the channel, in the case where the channel is formed with electrons, the energy level of the channel is raised, while in the case where the channel is formed with holes, the energy level of the channel is lowered, thus the field-effect transistor serves as a normally-off transistor rather than a normally-on transistor.

The meaning of the above-mentioned phrase "X is formed on Y" includes not only the case where "X is formed directly on Y" but also the case where "X is formed indirectly on Y (with an intervening layer or an intervening film being interposed between X and Y)."

Here, the first semiconductor layer may include a carrier traveling layer and a carrier supplying layer; the carrier traveling layer has a bandgap energy smaller than a bandgap energy of the carrier supplying layer; and the channel is a two-dimensional carrier gas layer generated by a heterojunction between the carrier traveling layer and the carrier supplying layer as well as a voltage applied to the gate electrode.

With this configuration, by using the difference in bandgap energy between the carrier traveling layer and the carrier supplying layer, a high-concentration two-dimensional carrier gas serving as the channel is generated at the interface between the carrier traveling layer and the carrier supplying layer. The high-concentration two-dimensional carrier gas enables the field-effect transistor to be driven with a large current, thus allows the field-effect transistor to be used as a power transistor.

Here, carriers in the channel are electrons, and the second semiconductor layer may be formed of a p-type semiconductor.

With this configuration, the second semiconductor layer has the p-type conductivity type opposite to that of the channel, thus enables a normally-off field-effect transistor to be achieved.

Here, an end of the channel which terminates at the interface portion may be depleted by the second region in an OFF state of the field-effect transistor, and a portion other than the end of the channel, directly below the second semiconductor layer may be depleted by the second semiconductor layer.

With this configuration, in the case where the channel is formed with electrons, the second region sufficiently raises the energy level of the channel at the end (the area where the channel collides with the interface between the containing region and the non-containing region) below the second semiconductor layer, while in the case where the channel is formed with holes, the second region sufficiently lowers the energy level at the end of the channel. Thereby, the end of the channel below the gate is also depleted.

Here, p-type carrier concentration in the second region may be greater than or equal to $1 \times 10^{15}$ cm$^{-3}$.

With this configuration, the channel below the gate can be depleted.

Here, the field-effect transistor further may include a second containing region, as an isolation region including the non-conductive impurities, the second containing region being formed in a periphery of the containing region and the second semiconductor layer.

With this configuration, the leakage current can be further suppressed. This is because the path of the leakage current which flows from the end of the channel below the gate through the interface between the containing region and the non-containing region, to the interface between the containing region and the second semiconductor layer can be intercepted by the second containing region.

Here, the non-conductive impurities may be transition metal ions.

Here, the non-conductive impurities may be at least one of Fe ions and Ru ions.

Here, each of the first semiconductor layer and the second semiconductor layer may include a nitride semiconductor.

With this configuration, the OFF-breakdown voltage can be further increased compared with the conventional transistor using Si or GaAs as material.

Here, the containing region may include one of the following (a) to (d) as the non-conductive impurity. (a) F ion, (b) C ion, (c) F ion and C ion, (d) F ion and B ion.

Here, at least one of the concentrations of F ion, C ion, and B ion may be $1\times10^{18}$ cm$^{-3}$ or greater and $1\times10^{22}$ cm$^{-3}$ or less.

Another field-effect transistor of the present invention includes a substrate; a first semiconductor layer including a plurality of semiconductor layers stacked on the substrate, and including a channel; a source electrode and a drain electrode which are formed on the first semiconductor layer; a gate electrode; and a second semiconductor layer formed on the first semiconductor layer and below the gate electrode, wherein the second semiconductor layer has a band gap less than a band gap of one layer of the first semiconductor layer, the layer contacting with the second semiconductor layer, the first semiconductor layer has a containing region which contains non-conductive impurities, and a non-containing region which does not contain non-conductive impurities, the containing region has an increased resistance by including the non-conductive impurities, the increased resistance being higher than a resistance of the non-containing region, the first semiconductor layer includes a first region, the first region is defined by a vicinity region of a portion of an interface between the containing region and the non-containing region, the portion of the interface being directly below the second semiconductor layer, the vicinity region including the portion of the interface and being included in the containing region, the second semiconductor layer includes a second region, the second region is located directly above the first region, and a concentration of the non-conductive impurities of the second region is lower than a concentration of the non-conductive impurities of the first region.

A method of manufacturing the field-effect transistor of the present invention includes: forming a first semiconductor layer and a second semiconductor layer sequentially on a substrate by epitaxial growth, the first semiconductor layer including a plurality of semiconductor layers and a channel, the second semiconductor layer having a conductivity type opposite to a conductivity type of the channel; removing a portion of the second semiconductor layer, the portion of the second semiconductor layer not corresponding to a gate; selectively introducing non-conductive impurities to a peripheral portion of the first semiconductor layer; forming a source electrode and a drain electrode on the first semiconductor layer; and forming a gate electrode on the second semiconductor layer, wherein in the selectively introducing, the non-conductive impurities are introduced so that a concentration of the non-conductive impurities of the second semiconductor layer is lower than a concentration of the non-conductive impurities of the first semiconductor layer.

With this configuration, the above-described field-effect transistor can be produced, which can achieve normally-off and a small leakage current and a high OFF-breakdown voltage.

Another method of manufacturing the field-effect transistor of the present invention includes: forming a first semiconductor layer and a second semiconductor layer sequentially on a substrate by epitaxial growth, the first semiconductor layer including a plurality of semiconductor layers and a channel, the second semiconductor layer having a band gap less than a band gap of one layer of the first semiconductor layer, the layer contacting with the second semiconductor layer; removing a portion of the second semiconductor layer, the portion of the second semiconductor layer not corresponding to a gate; selectively introducing non-conductive impurities to a peripheral portion of the first semiconductor layer; forming a source electrode and a drain electrode on the first semiconductor layer; and forming a gate electrode on the second semiconductor layer, wherein in the selectively introducing, the non-conductive impurities is introduced so that a concentration of the non-conductive impurities of the second semiconductor layer is lower than a concentration of the non-conductive impurities of the first semiconductor layer.

Still another method of manufacturing the field-effect transistor of the present invention includes: forming a first semiconductor layer sequentially on a substrate by epitaxial growth, the first semiconductor layer including a plurality of semiconductor layers and a channel; introducing non-conductive impurities to a peripheral region of the first semiconductor layer; selectively forming a second semiconductor layer at a portion corresponding to a gate, the second semiconductor layer having a conductivity type opposite to a conductivity type of the channel; forming a source electrode and a drain electrode on the first semiconductor layer; and forming a gate electrode on the second semiconductor layer.

With this configuration, the leakage current can be reduced more securely. Because the second semiconductor layer is formed after introducing non-conductive impurities to the first semiconductor layer, the second region does not include a non-conductive impurities (i.e., includes more p-type impurities), thus the end of the channel below the gate can be depleted more securely.

Still another method of manufacturing the field-effect transistor of the present invention includes: forming a first semiconductor layer sequentially on a substrate by epitaxial growth, the first semiconductor layer including a plurality of semiconductor layers and a channel; introducing non-conductive impurities to a peripheral region of the first semiconductor layer; selectively forming a second semiconductor layer at a portion corresponding to a gate, the second semiconductor layer having a band gap less than a band gap of a surface layer of the first semiconductor layer; forming a source electrode and a drain electrode on the first semiconductor layer; and forming a gate electrode on the second semiconductor layer.

According to the present invention, a normally-off field-effect transistor having a small leakage current and a high OFF-breakdown voltage can be achieved. The field-effect transistor can be driven with a large current, thus allows the field-effect transistor to be used as a power transistor. Furthermore, the path of the leakage current which flows through the interface between the containing region and the second semiconductor layer can be intercepted.

FURTHER INFORMATION ABOUT TECHNICAL BACKGROUND TO THIS APPLICATION

The disclosure of Japanese Patent Application No. 2009-012228 filed on Jan. 22, 2009 including specification, drawings and claims is incorporated herein by reference in its entirety.

The disclosure of PCT application No. PCT/JP2010/000232 filed on Jan. 18, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

First Embodiment

A first embodiment of the present invention is described with reference to the drawings.

Figure 1:
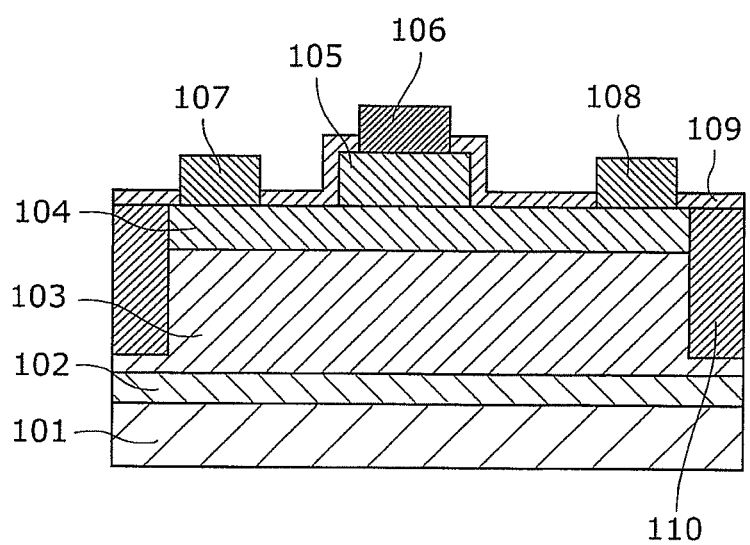
FIG. 1 is a sectional view of a field-effect transistor according to a first embodiment of the present invention.

FIG. 1 shows a structural diagram of a sectional view of a field-effect transistor according to the first embodiment of the present invention. As shown in FIG. 1, the field-effect transistor according to the first embodiment includes a buffer layer 102 including aluminum nitride (AlN), having a film thickness of 100 nm, an undoped gallium nitride (GaN) layer 103 having a film thickness of 2 μm, an undoped aluminum gallium nitride (AlGaN) layer 104 having a film thickness of 25 nm, and a p-type AlGaN layer 105 having a film thickness of 50 nm that are sequentially formed by epitaxial growth on a sapphire substrate 101 including sapphire having the plane orientation of the (0001) plane. Here, the Al composition in each of AlGaN layers 104 and 105 is 20%. For the undoped GaN layer 103, $Al_xGa_{1-x}N$ (where $0 \le x \le 1$) may be used; for the undoped AlGaN layer 104, $Al_yGa_{1-y}N$ (where $0 < y \le 1$) may be used; and for the p-type AlGaN layer 105, $Al_zGa_{1-z}N$ (where $0 \le z \le 1$) may be used. "Undoped" herein means that impurities are not intentionally added.

A gate electrode 106 including nickel (Ni) is formed by ohmic-contacting to the p-type AlGaN layer 105. Also, on the both sides away from the gate electrode 106, a source electrode 107 and a drain electrode 108 including titanium (Ti) and aluminum (Al), respectively are formed so as to be in contact with the undoped AlGaN layer 104.

SiN film 109 composed of silicon nitride (SiN) is formed as a protective film on the upper surface and the wall surface of the undoped AlGaN layer 104 and the p-type AlGaN layer 105, excluding the upper and wall surfaces of the gate electrode 106, the source electrode 107, and the drain electrode 108.

In the outer region with respect to the gate electrode 106, the source electrode 107, and the drain electrode 108, non-conductive impurities, for example, argon (Ar) ions are implanted so as to reach is the upper portion of the undoped GaN layer 103, thus an ion implantation region 110 with an increased resistance (i.e., electrically insulated or non-conductive region), that is to say, non-conductive impurities containing region is formed. The increased resistance means that the resistance of the ion implantation region 110 is higher than that of the two-dimensional electron gas layer which serves as a channel layer. Here, the region in the undoped GaN layer 103 and the undoped AlGaN layer 104, into which no ions are implanted, failing to achieve increased resistance is referred to as a non-conductive impurity containing region. The ions to be implanted are more preferably transition metal ions such as iron (Fe) ions or ruthenium (Ru) ions. Furthermore, the concentration of the non-conductive impurities in the containing region is preferably greater than or equal to $1 \times 10^{16}$ cm$^{-3}$.

Here, carrier concentration of the p-type AlGaN layer 105 should be sufficient to be able to deplete the channel below the p-type AlGaN layer 105, thus is preferably greater than or equal to $1 \times 10^{15}$. Also, in order to suppress the expansion of the depletion layer to the p-type AlGaN layer 105, the carrier concentration of the p-type AlGaN layer 105 is preferably greater than or equal to $1 \times 10^{18}$ cm$^{-3}$.

Figure 2:
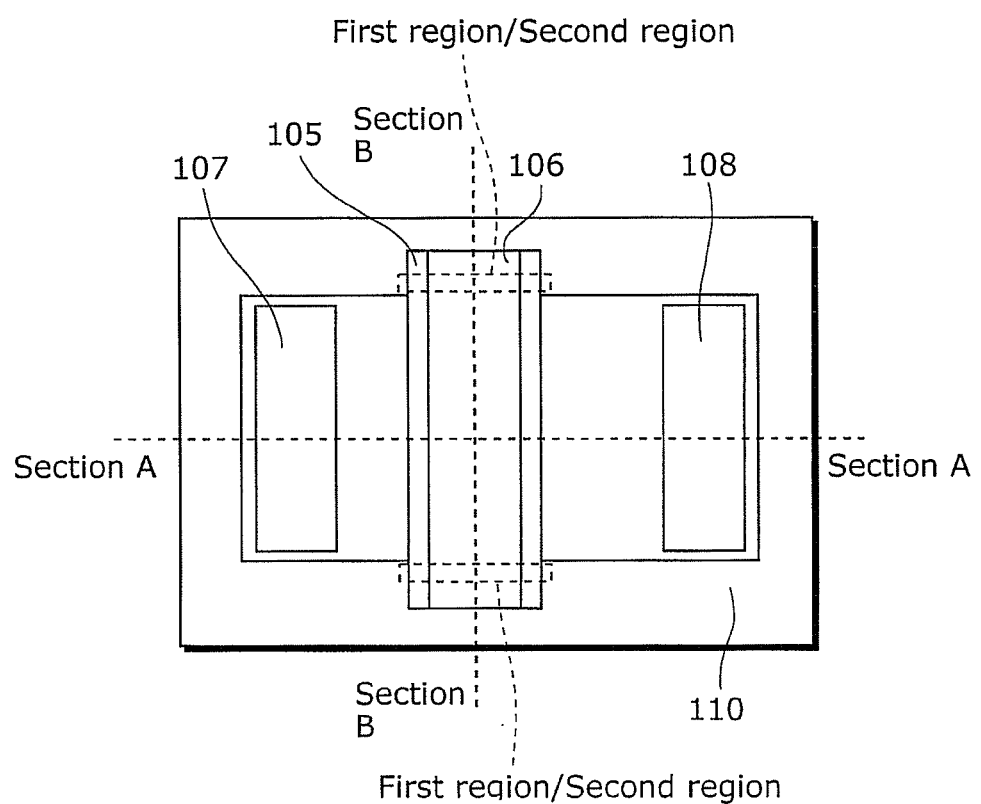
FIG. 2 is a plan view of the field-effect transistor according to the embodiment.

FIG. 2 is a plan view of the field-effect transistor according to the first embodiment of the present invention. The sectional view shown in FIG. 1 of the field-effect transistor of the present embodiment is taken along the dotted line A shown in the plan view of the field-effect transistor of the present embodiment of FIG. 2. The ion implantation region 110 formed by implanting ions is created only in the undoped GaN layer 103 and the undoped AlGaN layer 104, and no ions are implanted into the p-type AlGaN layer 105, thus no ion implantation region is formed therein.

Figure 3A:
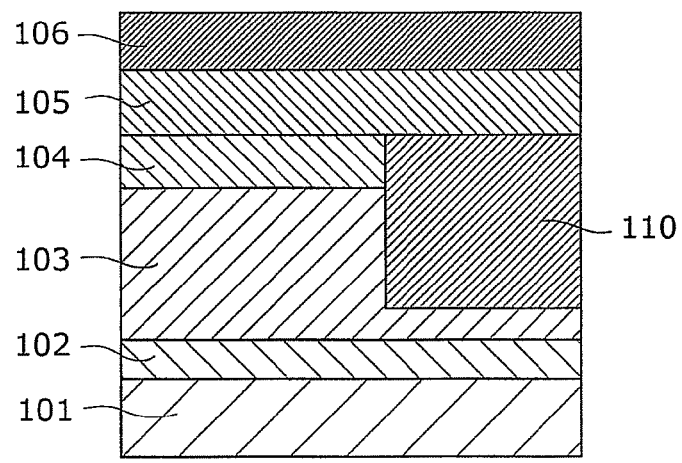
FIG. 3A is a sectional view of the field-effect transistor according to the embodiment.
Figure 3B:
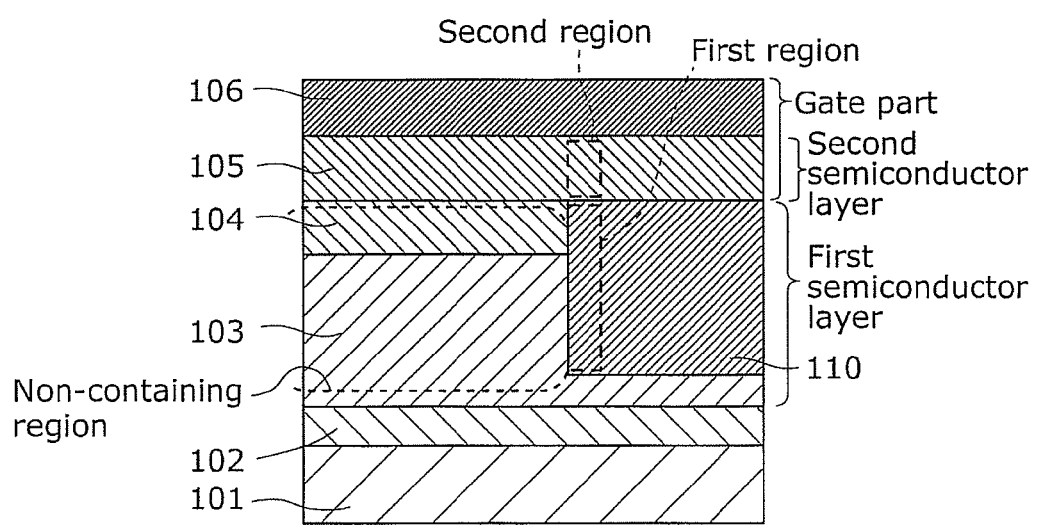
FIG. 3B is a sectional view of the field-effect transistor according to the embodiment.

FIGS. 3A and 3B are sectional views of the field-effect transistor according to the first embodiment of the present invention. FIG. 3B shows the regions relevant to control of leakage current. FIGS. 3A and 3B are sectional views only in the right half of the portion just below the gate electrode 106 out of the sections taken along the dotted line B shown in the plan view of the field-effect transistor of the present embodiment of FIG. 2.

As shown in FIG. 3B, the undoped AlGaN layer 104 and the undoped GaN layer 103 form the first semiconductor layer including a channel. Here, the channel means the two-dimensional electron gas caused by the heterojunction between the undoped AlGaN layer 104 and the undoped GaN layer 103.

The first semiconductor layer has the containing region (the ion implantation region 110) including non-conductive impurities which is provided as an isolation region, and the non-containing region which is other than the containing region. The non-containing region is the region that does not contain the non-conductive impurities. The containing region (the ion implantation region 110) is formed in the peripheral portion of the field-effect transistor as shown in FIG. 2.

The first semiconductor layer includes a first region. As shown by the dashed line of FIGS. 2 and 3B, the first region is defined by a vicinity of a portion of the interface between the containing region (the ion implantation region 110) and the non-containing region, the portion of the interface being directly below the above-mentioned second semiconductor layer, the vicinity including the portion of the interface and being included in the containing region.

The second semiconductor layer includes a second region. The second region is a region of the second semiconductor layer, which is located directly above the first region, as shown by the dashed line of FIG. 3B. The concentration of the non-conductive impurities of the second region is lower than that of the first region, or the second region does not include the non-conductive impurities.

The condition that the second region does not include the non-conductive impurities, or the concentration of the non-conductive impurities of the second region is lower than that of the first region simply means that the ion implantation region 110 is formed by an ion implantation only in a portion of the undoped GaN layer 103 and the undoped AlGaN layer 104, however, the ion implantation is not performed on the p-type AlGaN layer 105.

In the transistor of the present embodiment, no ions are implanted into the p-type AlGaN layer 105 located directly above the interface between the ion implantation region 110, and the undoped GaN layer 103, the undoped AlGaN layer 104, thus the energy potential of the interface is increased due to the built-in potential caused by the connection in series between the undoped GaN layer 103, the undoped AlGaN layer 104, and the p-type AlGaN layer 105. Accordingly, the remaining two-dimensional electron gas in the interface can be suppressed, and the leakage current can be reduced.

Figure 11A:
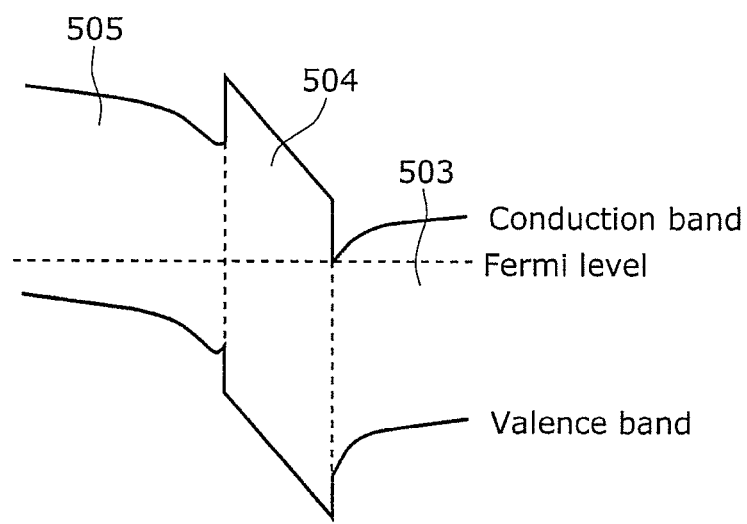
FIG. 11A is an energy band diagram in a section of the gate region in the conventional art.
Figure 11B:
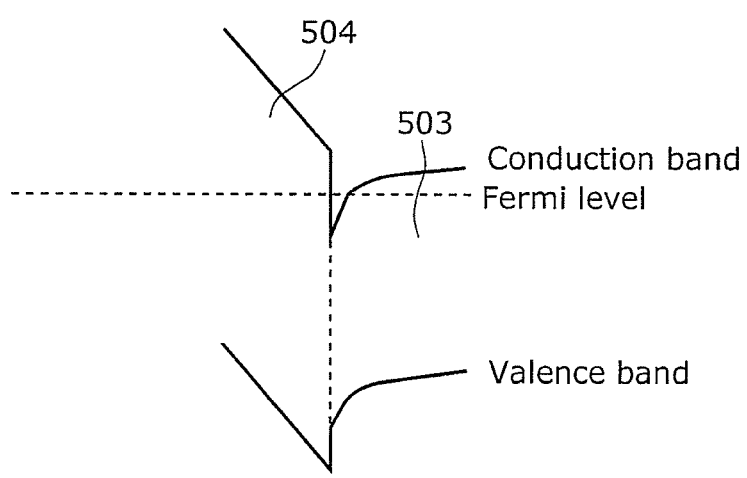
FIG. 11B is another energy band diagram in a section of the gate region in the conventional art.

In other words, the second region has the conductivity type opposite to that of the channel, and has a concentration (including 0) of the non-conductive impurities lower than that of the first region. That is to say, the second region has the conductivity characteristics opposite to that of the channel (two-dimensional electron gas). Therefore, the second semiconductor layer raises the energy level of the channel. That is to say, the second semiconductor layer raises the bandgap energy of FIG. 11B to that of FIG. 11A. In a similar manner, the second region sufficiently raises the energy level of the channel at the end (the area where the channel collides with the interface between the containing region and the non-containing region) below the gate electrode. Accordingly, the end of the channel is depleted when the field-effect transistor is OFF, thus occurrence of leakage current at the end of the channel below the gate electrode can be suppressed. Consequently, in the case where the field-effect transistor is used as a power transistor, heat generation due to the leakage current is suppressed, thus the OFF-breakdown voltage can be increased.

Also, the second semiconductor layer below the gate electrode has a conductivity type opposite to that of the channel, thus raises the energy level of the channel, and depletes the channel below the gate electrode. Accordingly, the field-effect transistor serves as a normally-off transistor rather than a normally-on transistor.

In order to suppress the remaining two-dimensional electron gas in the interface between the ion implantation region 110, and the undoped GaN layer 103, the undoped AlGaN layer 104, it is sufficient not to perform ion implantation on the p-type AlGaN layer 105 directly above the region of the vicinity of the interface containing the interface, included in the ion implantation region 110. It is sufficient for the vicinity herein to have possible fluctuation of the range of diffuse ions when the ions are implanted, i.e., the fluctuation of the interface between the ion implantation region 110, and the undoped GaN layer 103, the undoped AlGaN layer 104, (the interface between the non-conductive impurity containing region and the non-containing region), and the extent of the vicinity is preferably greater than or equal to 50 nm from the interface. The extent of the vicinity of 500 nm or greater is more effective, and with the extent of the vicinity of 1 μm or greater, the remaining two-dimensional electron gas can be effectively suppressed.

Figure 4:
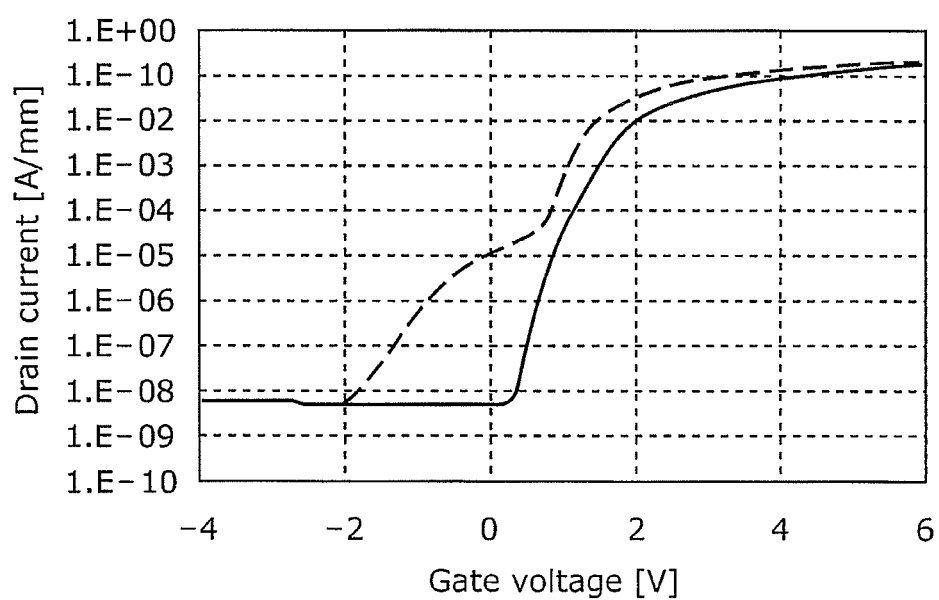
FIG. 4 is a graph showing the current-voltage characteristic of the field-effect transistor according to the embodiment.

The current-voltage (I-V) characteristic of the field-effect transistor formed in this manner is shown in FIG. 4. FIG. 4 shows the relationship between the gate voltage Vgs and the drain current Ids when the drain voltage Vds is set to 10V. The dashed line indicates the current-voltage characteristic in the case where the non-conductive impurities are implanted into the second region, and the solid line indicates the current-voltage characteristic in the case where the non-conductive impurities are not implanted into the second region. In the latter case, the leakage current is reduced in the OFF-state of the transistor, compared to the former case.

FIGS. 5A to 5F are sectional views showing the steps of the manufacturing method A for the transistor according to the present embodiment.

Figure 5A:
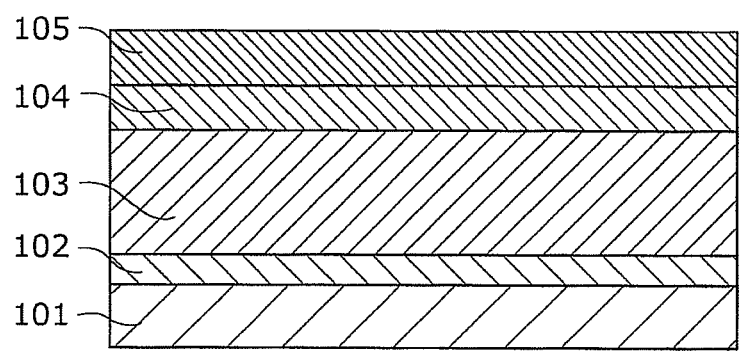
FIG. 5A is a diagram showing a step in a manufacturing method A for the field-effect transistor according to the embodiment.
Figure 5B:
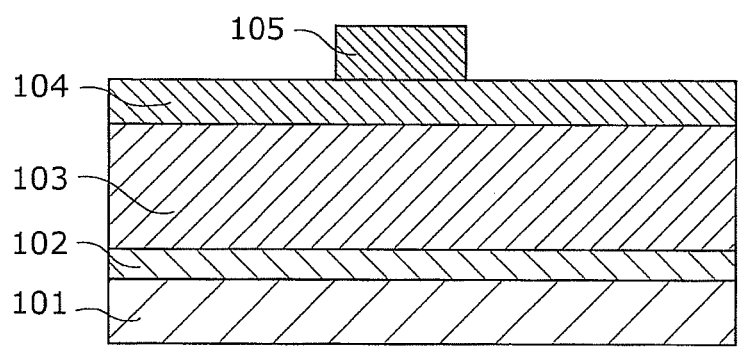
FIG. 5B is a diagram showing a step in the manufacturing method A for the field-effect transistor according to the embodiment.
Figure 5C:
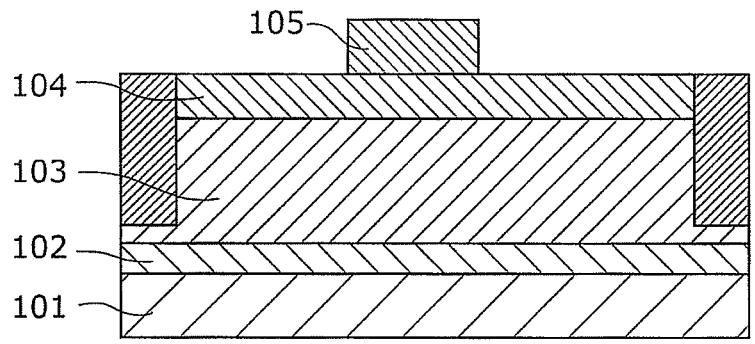
FIG. 5C is a diagram showing a step in the manufacturing method A for the field-effect transistor according to the embodiment.
Figure 5D:
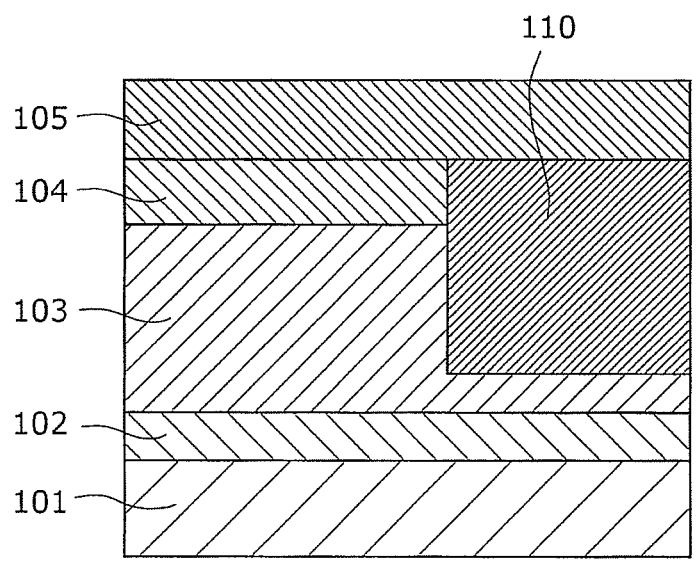
FIG. 5D is a diagram showing a step in the manufacturing method A for the field-effect transistor according to the embodiment.
Figure 5E:
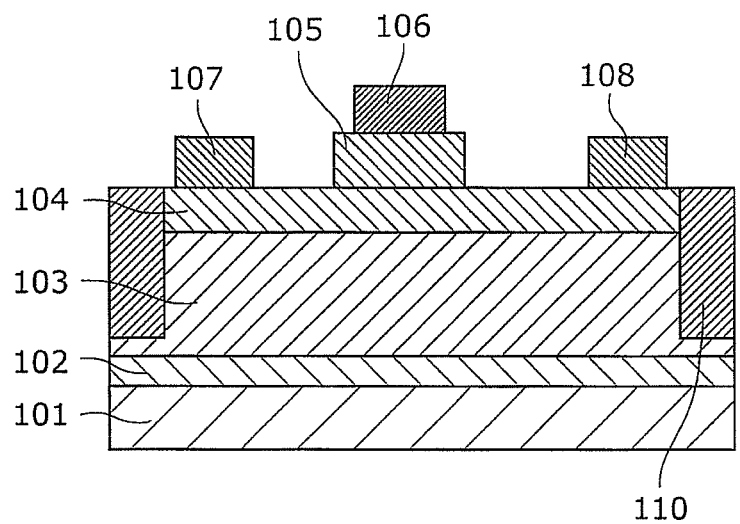
FIG. 5E is a diagram showing a step in the manufacturing method A for the field-effect transistor according to the embodiment.
Figure 5F:
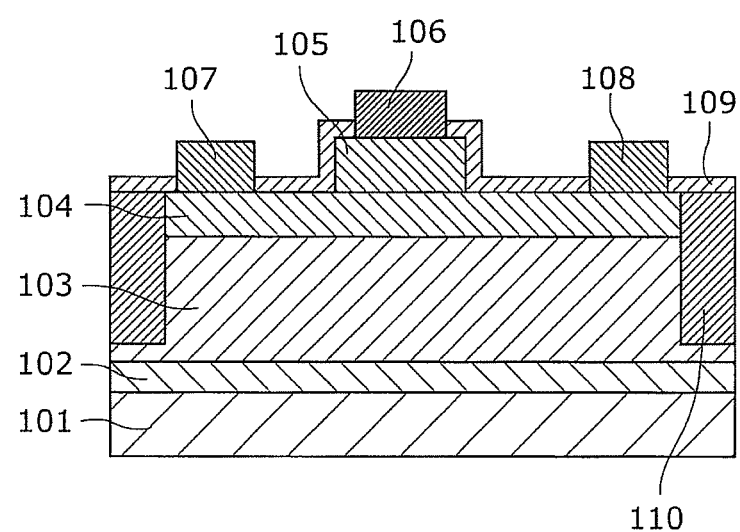
FIG. 5F is a diagram showing a step in the manufacturing method A for the field-effect transistor according to the embodiment.

First, as shown in FIG. 5A, an AlN buffer layer 102 having a thickness of 100 nm, an undoped GaN layer 103 having a thickness of 2 pm, an undoped AlGaN layer 104 having a thickness of 25 nm, and a p-type AlGaN layer 105 having a thickness of 100 nm are sequentially formed on the (0001) plane of a sapphire substrate 101 by MOCVD (Metal Organic Chemical Vapor Deposition). Subsequently, as shown in FIG. 5B, the portion of the p-type AlGaN layer 105, other than the gate region is selectively removed by dry etching such as ICP (Inductive-Coupled Plasma) etching. Furthermore, as shown in FIG. 5C (corresponding to the section taken along the B-B in FIG. 2) and FIG. 5D (corresponding to the section taken along the A-A in FIG. 2), ions such as Ar ions are implanted with the relevant surface being covered by a photoresist to form an ion implantation region so that the resistance of a portion of the undoped AlGaN layer 104 and the undoped GaN layer 103 is increased. At this point, the acceleration energy and the dose amount as the ions are implanted are controlled so that the implanted ions are present in the undoped GaN layer 103, the undoped AlGaN layer 104, and the impurity concentration of the p-type AlGaN layer 105 is made lower than that of the undoped GaN layer 103 and the undoped AlGaN layer 104. Subsequently, as shown in FIG. 5E, a Ni gate electrode 106 is formed on the p-type AlGaN layer 105; a Ti/Al source electrode 107 and a Ti/Al drain electrode 108 are formed on the undoped AlGaN layer 104. Then as shown in FIG. 5F, SiN protective film is deposited by e.g., plasma CVD.

FIGS. 6A to 6F are sectional views showing the steps of the manufacturing method B for the transistor according to the present embodiment.

Figure 6A:
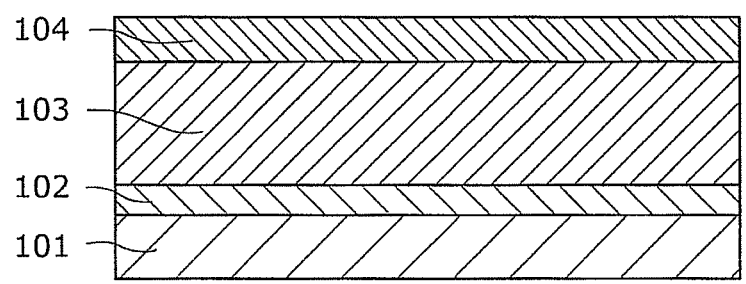
FIG. 6A is a diagram showing a step in a manufacturing method B for the field-effect transistor according to the embodiment.
Figure 6B:
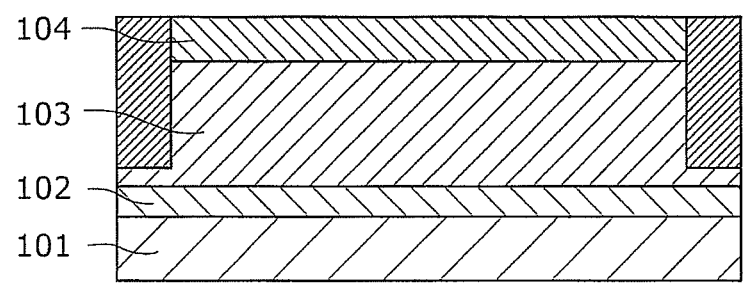
FIG. 6B is a diagram showing a step in the manufacturing method B for the field-effect transistor according to the embodiment.
Figure 6C:
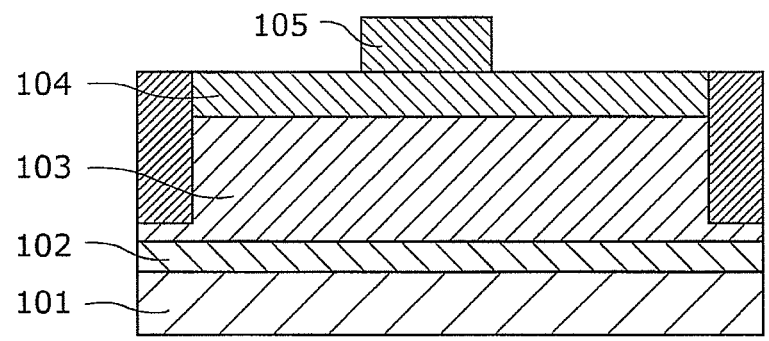
FIG. 6C is a diagram showing a step in the manufacturing method B for the field-effect transistor according to the embodiment.
Figure 6D:
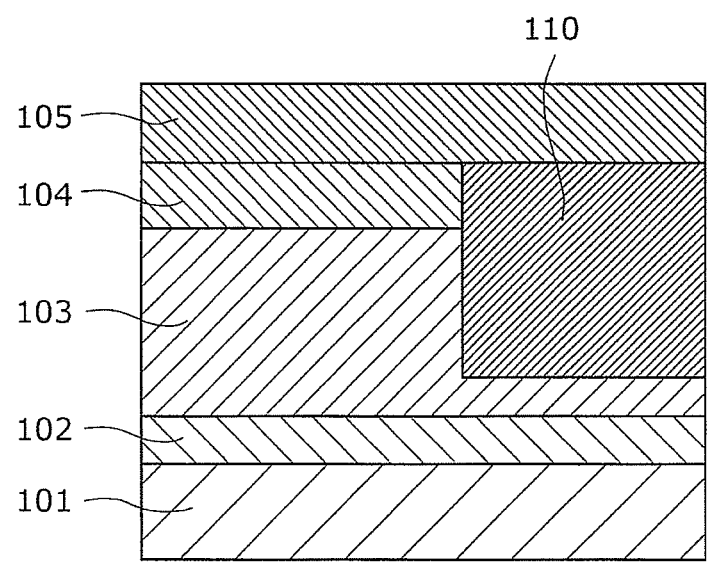
FIG. 6D is a diagram showing a step in the manufacturing method B for the field-effect transistor according to the embodiment.
Figure 6E:
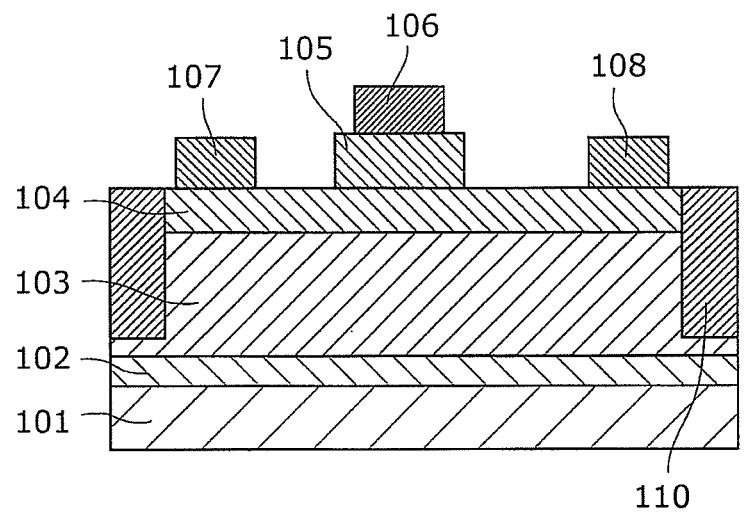
FIG. 6E is a diagram showing a step in the manufacturing method B for the field-effect transistor according to the embodiment.
Figure 6F:
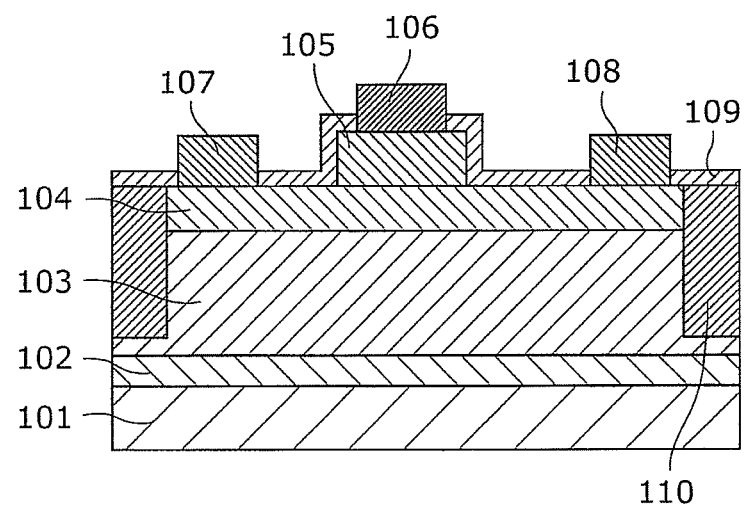
FIG. 6F is a diagram showing a step in the manufacturing method B for the field-effect transistor according to the embodiment.

First, as shown in FIG. 6A, an AlN buffer layer 102 having a thickness of 100 nm, an undoped GaN layer 103 having a thickness of 2 μm, and an undoped AlGaN layer 104 having a thickness of 25 nm are sequentially formed on the (0001) plane of a sapphire substrate 101 by MOCVD (Metal Organic Chemical Vapor Deposition). Subsequently, as shown in FIG. 6B, ions such as Ar ions are implanted with the relevant surface being covered by a photoresist to form an ion implantation region so that the resistance of a portion of the undoped AlGaN layer 104 and the undoped GaN layer 103 is increased. The ions to be implanted are more preferably transition metal ions such as iron (Fe) ions or ruthenium (Ru) ions. As shown in FIG. 6C (corresponding to the section taken along the B-B in FIG. 2) and FIG. 6D (corresponding to the section taken along the A-A in FIG. 2), a p-type AlGaN layer 105 having a thickness of 100 nm is selectively formed, then later, as shown in FIG. 6E, a Ni gate electrode 106 is formed on a p-type AlGaN layer 105; a Ti/Al source electrode 107 and a Ti/Al drain electrode 108 are formed on the undoped AlGaN layer 104. Subsequently, as shown in FIG. 6F, a SiN protective film is deposited by e.g., plasma CVD. With the manufacturing method B, the leakage current can be reduced more securely. This is because the second semiconductor layer (the p-type AlGaN layer 105) is formed after introducing the non-conductive impurities to a portion of the first semiconductor layer (the undoped AlGaN layer 104 and the undoped GaN layer 103), thus the second region does not include the non-conductive impurities (i.e., includes more p-type impurities), and accordingly the end of the channel below the gate can be depleted more securely.

Next, a modification of the field-effect transistor in the first embodiment of the present invention is described with reference to the drawings.

Figure 7:
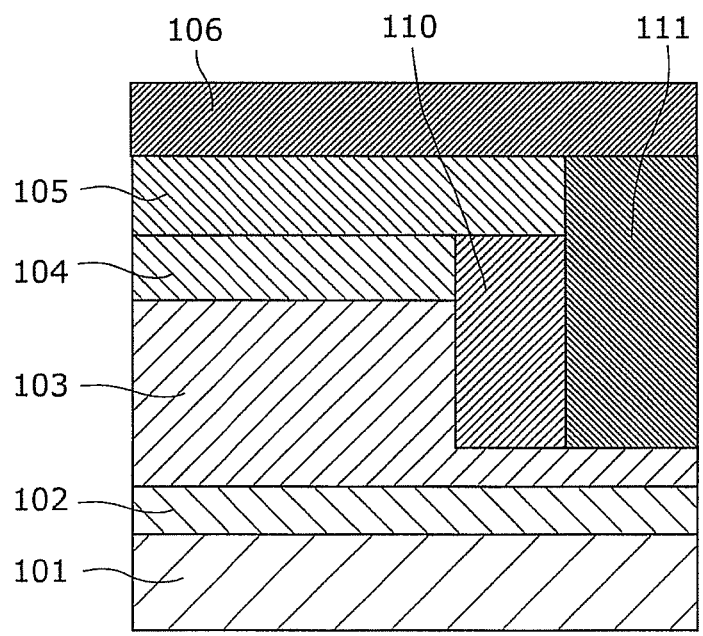
FIG. 7 is a sectional view of the field-effect transistor according to a modification of the embodiment.

FIG. 7 shows a structural diagram of a sectional view of a modification of the field-effect transistor in the first embodiment of the present invention. As shown in FIG. 7, the field-effect transistor according to the modification of the first embodiment differs from the field-effect transistor according to first embodiment shown in FIGS. 3A and 3B only in that an ion implantation region (2) is formed in the p-type AlGaN layer 105. That is to say, this field-effect transistor differs from the field-effect transistor of FIGS. 3A and 3B in that a second containing region (an ion implantation region (2) 111) is added, as an isolation region including the non-conductive impurities, the second containing region surrounding the peripheral portion of the containing region (the ion implantation region 110), and the second semiconductor layer (the p-type AlGaN layer 105) when viewed from the top.

As shown in FIG. 7, the interface between the ion implantation region (2) 111 and the p-type AlGaN layer 105 into which no ions are implanted is formed outward of the field-effect transistor from the interface between the ion implantation region 110 and the undoped AlGaN layer 104 into which no ions are implanted.

With the transistor of the present embodiment, due to the formation of the ion implantation region (2) 111 in the p-type AlGaN layer 105, the leakage current can be reduced using the p-type AlGaN layer 105, thus the overall leakage current can be further reduced. This is because the path of the leakage current which flows from the end of the channel below the gate through the interface between the containing region (the ion implantation region 110) and the non-containing region (the undoped AlGaN layer 104 and the undoped GaN layer 103 into which no ions are implanted), to the interface between the containing region and the second semiconductor layer (the p-type AlGaN layer 105) can be intercepted by the second containing region (the ion implantation region (2) 111). The above-mentioned path of the leakage current may be formed because of a variation in the manufacturing process, however, by providing the second containing region, the variation in the manufacturing process can be ignored or an acceptable range of variation can be increased.

Next, an exemplary manufacturing method C for the field-effect transistor according to the modification of the present embodiment is described. FIGS. 8A to 8H are sectional views showing the steps of the manufacturing method C for the semiconductor device according to the present embodiment.

Figure 8A:
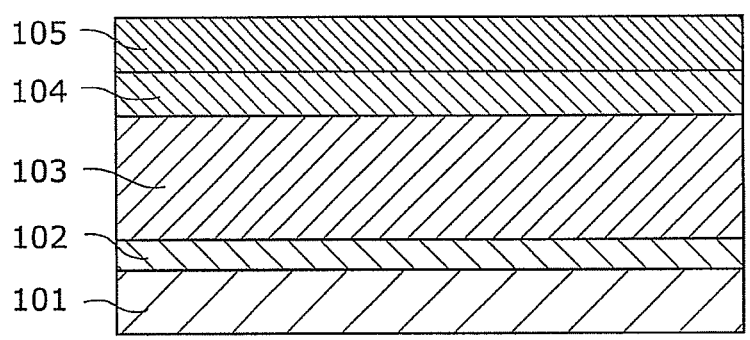
FIG. 8A is a diagram showing a step in a manufacturing method C for the field-effect transistor according to the modification of the embodiment.
Figure 8B:
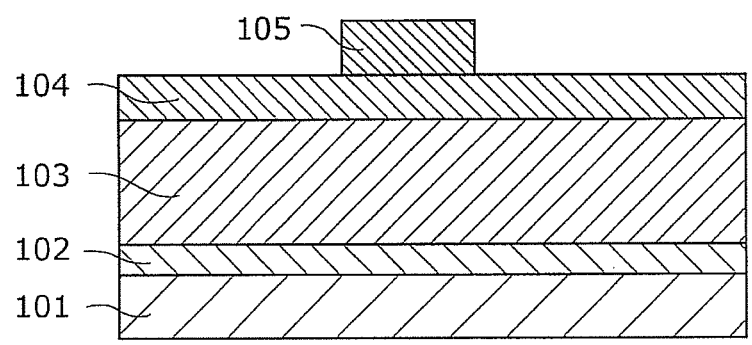
FIG. 8B is a diagram showing a step in the manufacturing method C for the field-effect transistor according to the modification of the embodiment.
Figure 8C:
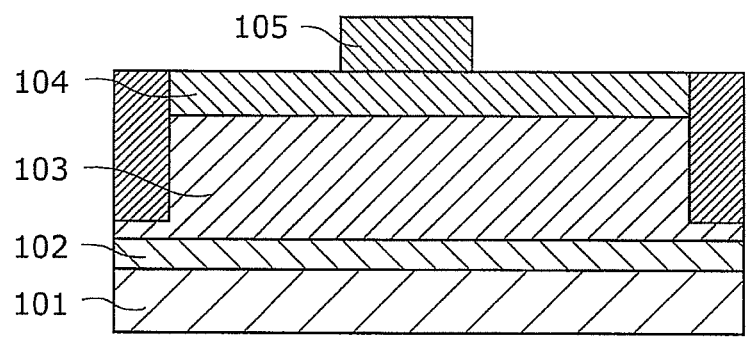
FIG. 8C is a diagram showing a step in the manufacturing method C for the field-effect transistor according to the modification of the embodiment.
Figure 8D:
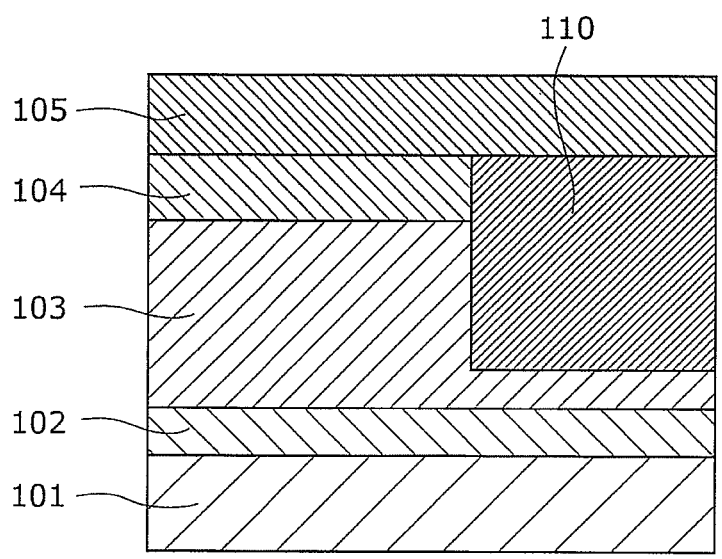
FIG. 8D is a diagram showing a step in the manufacturing method C for the field-effect transistor according to the modification of the embodiment.
Figure 8E:
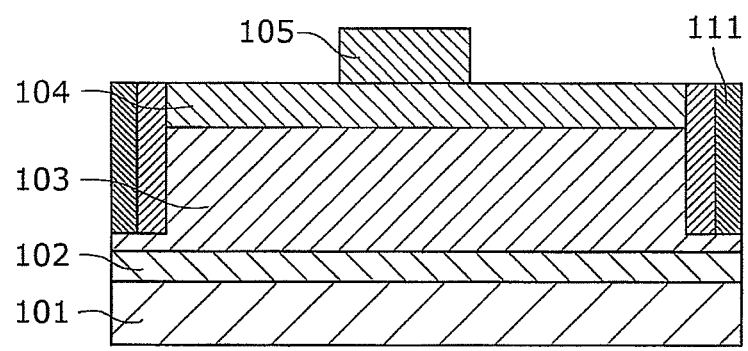
FIG. 8E is a diagram showing a step in the manufacturing method C for the field-effect transistor according to the modification of the embodiment.
Figure 8F:
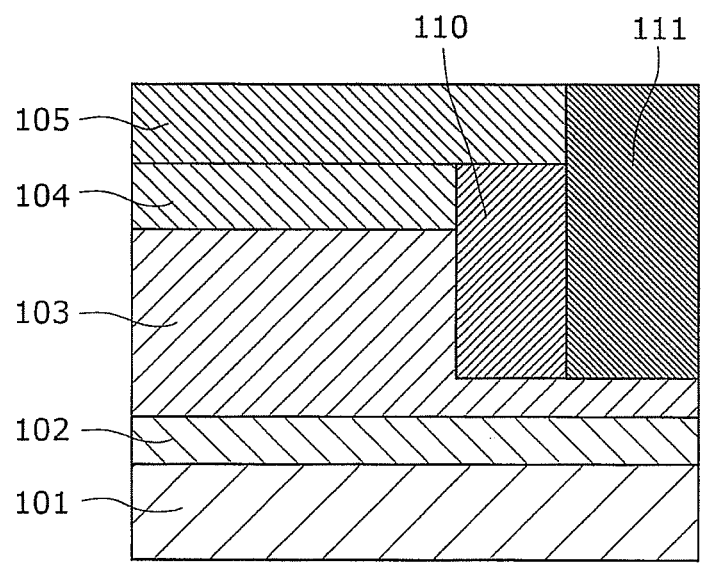
FIG. 8F is a diagram showing a step in the manufacturing method C for the field-effect transistor according to the modification of the embodiment.
Figure 8G:
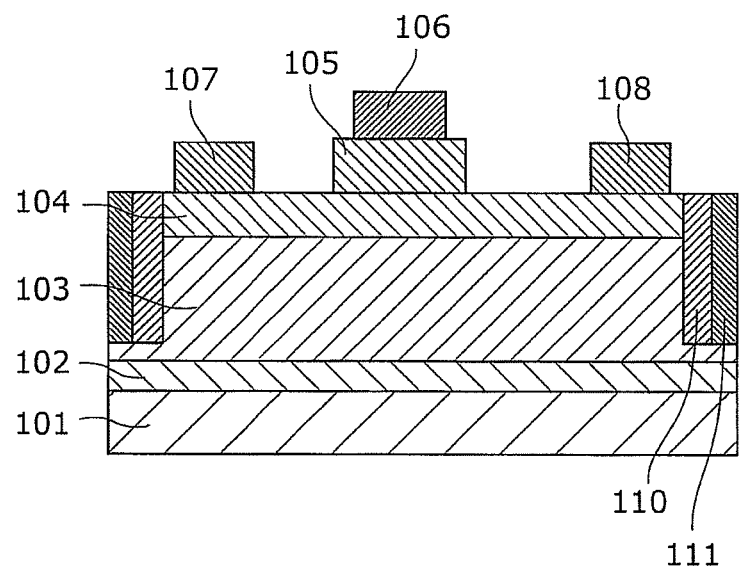
FIG. 8G is a diagram showing a step in the manufacturing method C for the field-effect transistor according to the modification of the embodiment.
Figure 8H:
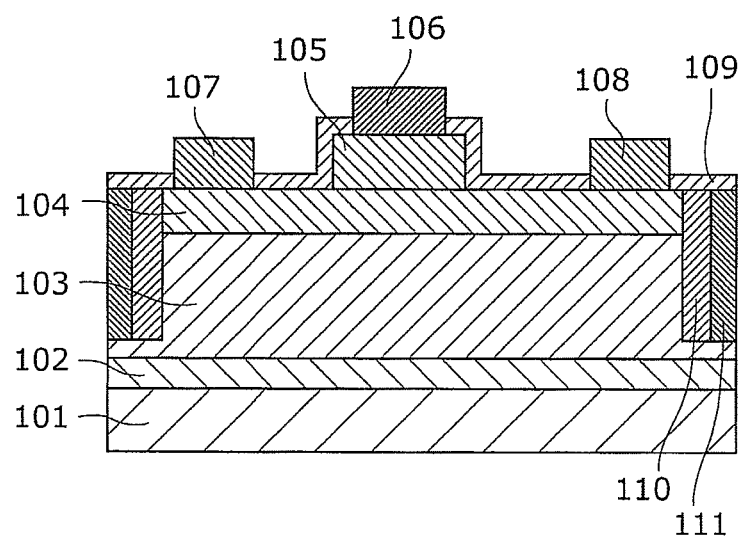
FIG. 8H is a diagram showing a step in the manufacturing method C for the field-effect transistor according to the modification of the embodiment.

First, as shown in FIG. 8A, an AlN buffer layer 102 having a thickness of 100 nm, an undoped GaN layer 103 having a thickness of 2 μm, an undoped AlGaN layer 104 having a thickness of 25 nm, and a p-type AlGaN layer 105 having a thickness of 100 nm are sequentially formed on the (0001) plane of a sapphire substrate 101 by MOCVD (Metal Organic Chemical Vapor Deposition). Subsequently, as shown in FIG. 8B, the portion of the p-type AlGaN layer 105, other than the gate region is selectively removed by dry etching such as ICP (Inductive-Coupled Plasma) etching. Furthermore, as shown in FIGS. 8C and 8D, ions such as Ar ions are implanted with the relevant surface being covered by a photoresist to form an ion implantation region so that the resistance of a portion of the undoped AlGaN layer 104 and the undoped GaN layer 103 is increased. At this point, the acceleration energy and the dose amount as the ions are implanted are controlled so that the implanted ions are present in the undoped GaN layer 103, the undoped AlGaN layer 104, and the impurity concentration of the p-type AlGaN layer 105 is made lower than that of the undoped GaN layer 103 and the undoped AlGaN layer 104. The ions to be implanted are preferably transition metal ions, and are more preferably iron (Fe) ions or ruthenium (Ru) ions. Subsequently, as shown in FIGS. 8E and 8F, ions such as Ar ions are implanted into an region outward of the ion implantation region 110 with the relevant surface being covered by a photoresist to form an ion implantation region (2) 111 so that the resistance of a portion of the p-type AlGaN layer 105, the undoped AlGaN layer 104 and the undoped GaN layer 103 is increased. As shown in FIG. 8G, a Ni gate electrode 106 is formed on the p-type AlGaN layer 105; a Ti/Al source electrode 107 and a Ti/Al drain electrode 108 are formed on the undoped AlGaN layer 104. Subsequently, as shown in FIG. 8H, a SiN protective film is deposited by e.g., plasma CVD.

Next, an exemplary manufacturing method D for the transistor according to the modification of the present embodiment is described. FIGS. 9A to 9H are sectional views showing the steps of the manufacturing method D for the semiconductor device according to the present embodiment.

Figure 9A:
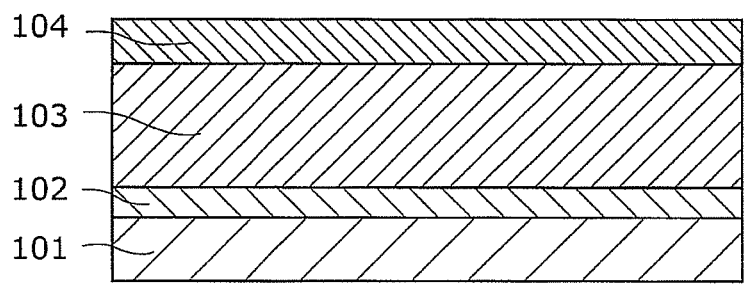
FIG. 9A is a diagram showing a step in a manufacturing method D for the field-effect transistor according to the modification of the embodiment.
Figure 9B:
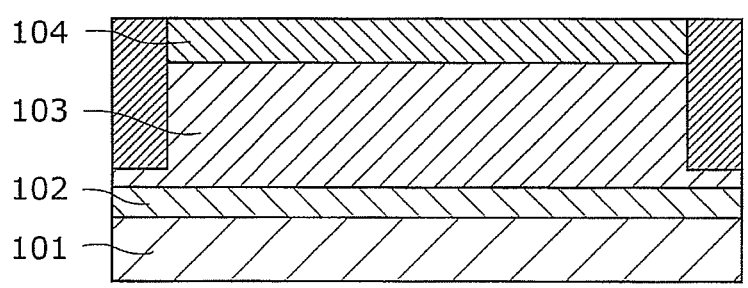
FIG. 9B is a diagram showing a step in the manufacturing method D for the field-effect transistor according to the modification of the embodiment.
Figure 9C:
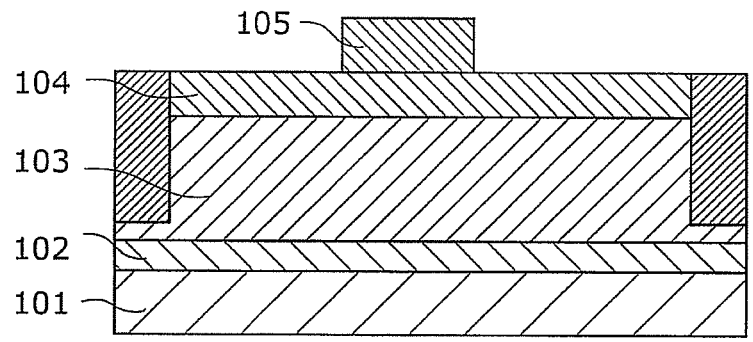
FIG. 9C is a diagram showing a step in the manufacturing method D for the field-effect transistor according to the modification of the embodiment.
Figure 9D:
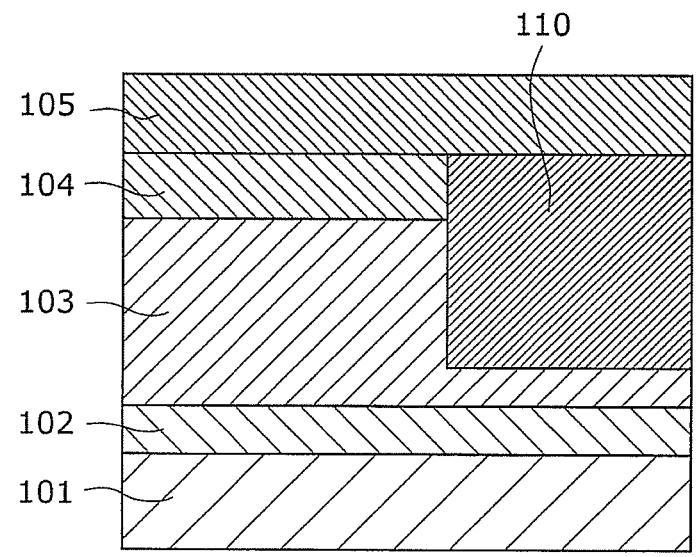
FIG. 9D is a diagram showing a step in the manufacturing method D for the field-effect transistor according to the modification of the embodiment.
Figure 9E:
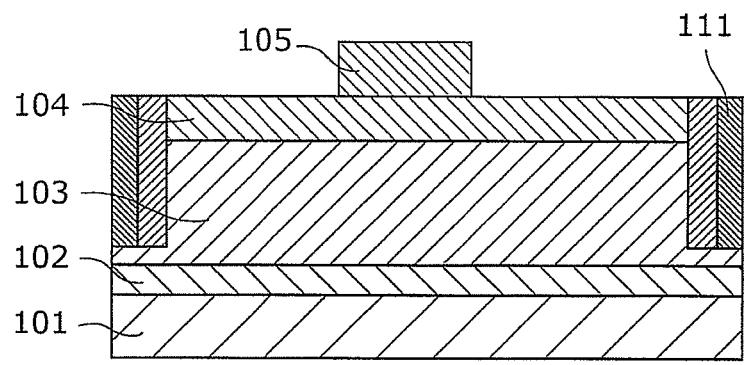
FIG. 9E is a diagram showing a step in the manufacturing method D for the field-effect transistor according to the modification of the embodiment.
Figure 9F:
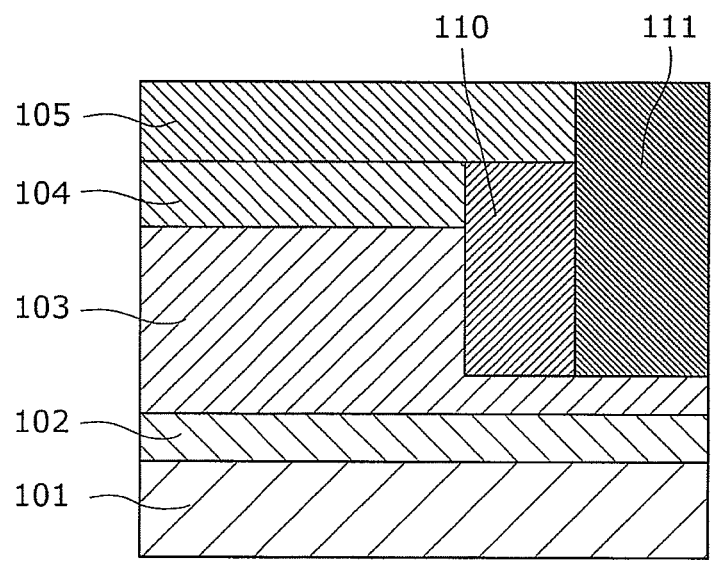
FIG. 9F is a diagram showing a step in the manufacturing method D for the field-effect transistor according to the modification of the embodiment.
Figure 9G:
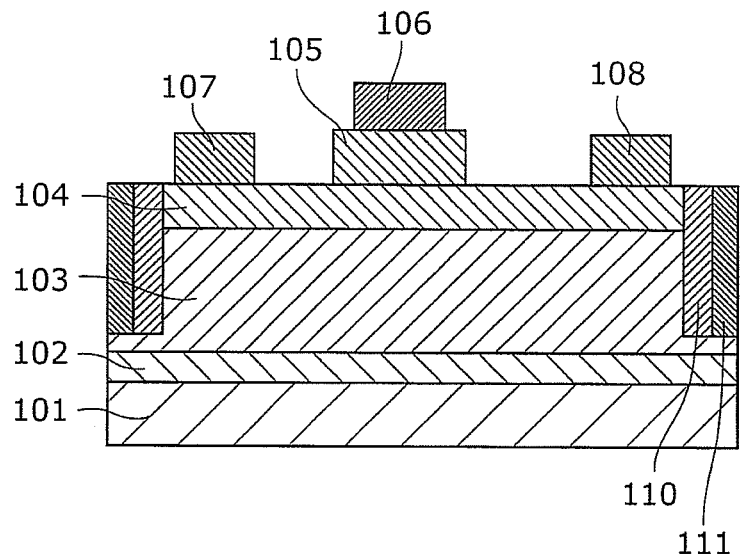
FIG. 9G is a diagram showing a step in the manufacturing method D for the field-effect transistor according to the modification of the embodiment.
Figure 9H:
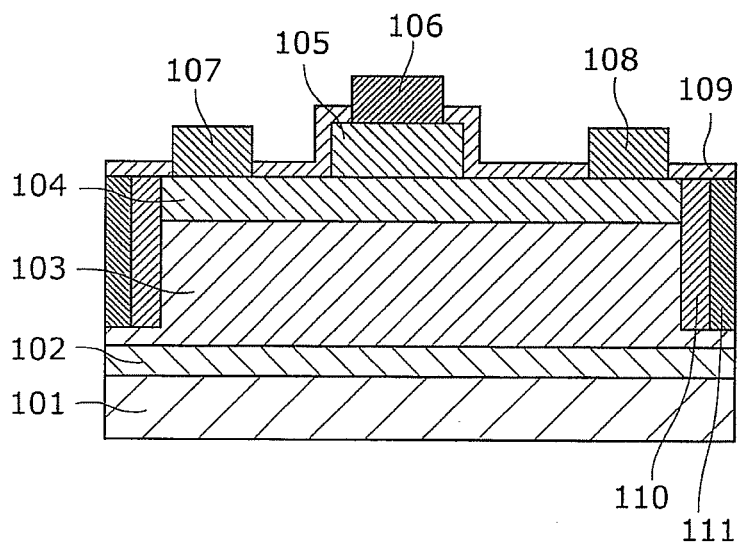
FIG. 9H is a diagram showing a step in the manufacturing method D for the field-effect transistor according to the modification of the embodiment.
Figure 10A:
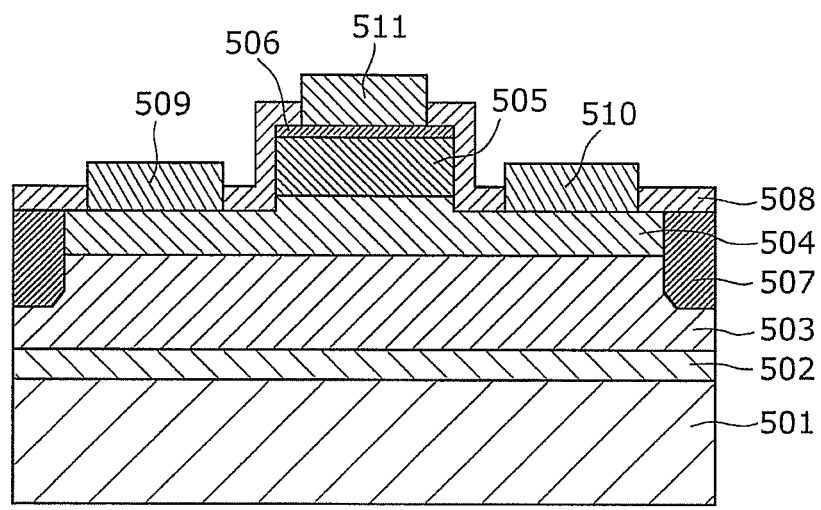
FIG. 10A is a sectional view of a field-effect transistor in the conventional art.
Figure 10B:
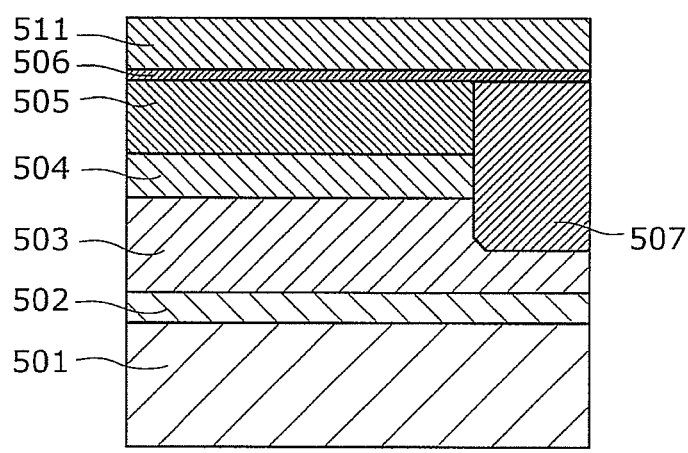
FIG. 10B is a sectional view of a field-effect transistor as a reference example of the present invention.

First, as shown in FIG. 9A, an AlN buffer layer 102 having a thickness of 100 nm, an undoped GaN layer 103 having a thickness of 2 μm, and an undoped AlGaN layer 104 having a thickness of 25 nm are sequentially formed on the (0001) plane of a sapphire substrate 101 by MOCVD (Metal Organic Chemical Vapor Deposition). Subsequently, as shown in FIG. 9B, ions such as Ar ions are implanted with the relevant surface being covered by a photoresist to form an ion implantation region so that the resistance of a portion of the undoped AlGaN layer 104 and the undoped GaN layer 103 is increased. The ions to be implanted are more preferably transition metal ions such as iron (Fe) ions or ruthenium (Ru) ions. As shown in FIGS. 9C and 9D, a p-type AlGaN layer 105 having a thickness of 100 nm is selectively formed, then later, as shown in FIGS. 9E and 9F, ions such as Ar ions are implanted into an region outward of the ion implantation region 110 with the relevant surface being covered by a photoresist to form an ion implantation region (2) 111 so that the resistance of a portion of the p-type AlGaN layer 105, the undoped AlGaN layer 104 and the undoped GaN layer 103 is increased. As shown in FIG. 9G, a Ni gate electrode 106 is formed on the p-type AlGaN layer 105; a Ti/Al source electrode 107 and a Ti/Al drain electrode 108 are formed on the undoped AlGaN layer 104. Subsequently, as shown in FIG. 9H, a SiN protective film is deposited by e.g., plasma CVD. With the manufacturing method D, the leakage current can be reduced more securely because of the same reason as in the above-described manufacturing method B, while the leakage current can be further reduced because of the interception by the second containing region (the ion implantation region (2) 111).

In the field-effect transistor of the above-described embodiment, the second semiconductor layer is composed of a p-type AlGaN, and the first semiconductor layer is composed of an i-AlGaN and an i-GaN (i denotes undoped), however, these semiconductor layers may be composed of different nitride-based materials. For example, the second semiconductor layer may be composed of a p-type GaN, and the first semiconductor layer may be composed of an i-AlGaN and an i-InGaN.

Also, gallium arsenide-based materials may be used in the field-effect transistor of the above-described embodiment. For example, the second semiconductor layer may be composed of a p-type GaAs; the first semiconductor layer may be composed of an n-type AlGaAs and i-GaAs; and a semi insulating GaAs substrate may be used instead of the sapphire substrate.

Alternatively, indium phosphide-based materials may be used in the field-effect transistor of the above-described embodiment. For example, the second semiconductor layer may be composed of a p-type InGaAs; the first semiconductor layer may be composed of an n-type InAlAs and i-InGaAs; and a semi insulating InP substrate may be used instead of the sapphire substrate. In this case, epitaxial growth of the first semiconductor layer and the second semiconductor layer on the semi insulating InP substrate increases the In composition relatively more than with the GaAs substrate, thus a field-effect transistor having a higher electron mobility can be achieved.

The containing region (the ion implantation region 110), the first region, and the second region may not be formed along the entire periphery of the field-effect transistor, and may be formed at least in the portion of the periphery below the gate electrode. For example, in FIG. 7, the containing region (the ion implantation region 110), the first region, and the second region may be formed only in the portion below the gate electrode.

Alternatively, the containing region (the ion implantation region 110) may be formed along the entire periphery of the field-effect transistor, and the first region and the second region may be formed at least in the portion of the periphery below the gate electrode.

In the description of the above embodiments, AlGaN represents $Al_xGa_{1-x}N$ (where $0<x<1$); InGaN represents $In_yGa_{1-y}N$ (where $0<y<1$); InAlGaN represents $In_yAl_xGa_{1-x-y}N$ (where $0<x<1$, $0<y<1$, and $0<x+y<1$). Similar notational rule applies to InGaAs and InAlAs.

In the field-effect transistor of the above-described embodiments, the channel is the two-dimensional electron gas and the second semiconductor layer is p-type, however, without being limited to this configuration, the channel may be two-dimensional hole gas and the second semiconductor layer may be n-type.

In this case, an AlN buffer layer, an undoped AlGaN layer, an undoped GaN layer, and an n-type AlGaN layer are sequentially formed on a sapphire substrate, and a Ni source electrode and a Ni drain electrode are formed so as to be in contact with the undoped GaN layer so that an ohmic electrode including Ti/Al is formed in the n-type AlGaN layer. In this manner, two-dimensional hole gas occurs at the interface between the undoped AlGaN layer and the undoped GaN layer, and the energy levels of the undoped AlGaN layer, the undoped GaN layer directly below the n-type AlGaN are raised due to the connection with the n-type AlGaN, thus the two-dimensional hole gas is depleted and normally-off operation can be achieved. Also, the leakage current can be reduced by performing the ion implantation similarly to the above-described embodiments.

In the above-described embodiments, the second semiconductor layer is assumed to have a conductivity type opposite to that of the channel, however, this assumption is for providing one of the means to deplete the channel below the second semiconductor layer. For example, even when the second semiconductor layer is formed with a material whose band gap is less than that of the contacting layer of the first semiconductor layer with the second semiconductor layer, the channel below the second semiconductor layer can be depleted in a similar manner.

For example, an AlN buffer layer, an undoped GaN layer, an undoped AlGaN layer and an undoped InGaN layer are sequentially formed on a sapphire substrate; a Ti/Al source electrode and a Ti/Al drain electrode are formed so as to be in contact with the undoped AlGaN; and a Ni gate electrode is formed so as to be in contact with the undoped InGaN layer. In this manner, the piezo electric field caused by the connection between the undoped InGaN layer and the undoped AlGaN layer raises the energy levels of the undoped GaN layer and the undoped AlGaN layer directly below the undoped InGaN, thus the two-dimensional hole gas is depleted and normally-off operation can be achieved. Also, the leakage current can be reduced by performing the ion implantation similarly to the above-described embodiments.

The above-described embodiments show examples where each of the source electrode 107 and the drain electrode 108 is formed on the first semiconductor layer (the undoped AlGaN layer 104), however, each of the source electrode 107 and the drain electrode 108 may have a recess structure. That is to say, each of two electrodes may be embedded in a recess which penetrates from the surface of the semiconductor device through the first semiconductor layer (the undoped AlGaN layer 104) and the two-dimensional electron gas layer to the inside of the undoped GaN layer 103.

In all the embodiments, the ions to be implanted into the ion implantation region 110 and the ion implantation region (2) 111 are preferably C ions or F ions, and it is more preferable that F ions and C ions coexist simultaneously, or F ions and B ions coexist.

During the process of manufacturing transistors, a wafer thereof may be exposed to a high temperature, and generated heat may cause the resistance of a region, which has been increased due to an ion implantation, to be decreased. Simultaneous coexistence of F ions and C ions, or coexistence of F ions and B ions increases the resistance of the wafer to heat, thus reduction in the resistance of an ion implantation region can be lowered. The concentrations of F ions, C ions, and B ions are preferably greater than or equal to $1\times10^{18}$ cm$^{-3}$, and are more preferably in a range of $1\times10^{19}$ cm$^{-3}$ or greater and $1\times10^{22}$ cm$^{-3}$ or less.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The transistor and the method of manufacturing the transistor according to the present invention can achieve a normally-off semiconductor device having a high OFF-breakdown voltage, and is useful for a field effect transistor using a nitride semiconductor and a method of manufacturing the field effect transistor that can be applied to, for example, a power transistor used in a power supply circuit or the like of a consumer-product.

What is claimed is:
1. A field-effect transistor comprising:
a substrate;
a first semiconductor layer including a plurality of semiconductor layers stacked on said substrate, and including a channel;
a source electrode and a drain electrode which are formed on said first semiconductor layer;
a gate electrode; and
a second semiconductor layer formed on said first semiconductor layer and below said gate electrode, said second semiconductor layer having a conductivity type opposite to a conductivity type of the channel, wherein:
said first semiconductor layer has a containing region which contains first impurities, and a non-containing region which does not contain the first impurities,
said containing region includes a first region, the first region is defined by a vicinity region of a portion of an interface between the containing region and the non-containing region,
said second semiconductor layer includes a second region, the second region is located directly above the first region,
a concentration of the first impurities of the second region is lower than a concentration of the first impurities of the first region, and
both of said first region and said second region are located directly below an end portion of said gate electrode.
2. The field-effect transistor according to claim 1,
wherein said first semiconductor layer includes a carrier traveling layer and a carrier supplying layer;
the carrier traveling layer has a bandgap energy smaller than a bandgap energy of the carrier supplying layer; and
the channel is a two-dimensional carrier gas layer generated by a heterojunction between the carrier traveling layer and the carrier supplying layer as well as a voltage applied to said gate electrode.
3. The field-effect transistor according to claim 1,
wherein carriers in the channel are electrons; and
said second semiconductor layer is formed of a p-type semiconductor.

4. The field-effect transistor according to claim 1,
wherein an end of the channel which terminates at the interface portion is depleted by the second region in an OFF state of said field-effect transistor, and a portion other than the end of the channel, directly below said second semiconductor layer is depleted by said second semiconductor layer.

5. The field-effect transistor according to claim 3,
wherein p-type carrier concentration in the second region is greater than or equal to $1 \times 10^{15}$ cm$^{-3}$.

6. The field-effect transistor according to claim 1, further comprising:
a second containing region, as an isolation region including the first impurities, the second containing region being formed in a periphery of the containing region and said second semiconductor layer.

7. The field-effect transistor according to claim 1,
wherein the first impurities are transition metal ions.

8. The field-effect transistor according to claim 7,
wherein the first impurities are at least one of Fe ions and Ru ions.

9. The field-effect transistor according to claim 1,
wherein each of said first semiconductor layer and said second semiconductor layer includes a nitride semiconductor.

10. The field-effect transistor according to claim 1,
wherein the containing region contains F ions as the first impurities.

11. The field-effect transistor according to claim 1,
wherein the containing region contains C ions as the first impurities.

12. The field-effect transistor according to claim 1,
wherein the first impurities of the containing region include F ions and C ions.

13. The field-effect transistor according to claim 1,
wherein the containing region contains F ions and B ions as the first impurities.

14. The field-effect transistor according to claim 10,
wherein at least one of concentrations of the F ion, the C ion, and the B ion is $1 \times 10^{18}$ cm$^{-3}$ or greater and $1 \times 10^{22}$ cm$^{-3}$ or less.

15. The field-effect transistor according to claim 1, wherein:
the portion of the interface is located directly below an end portion of said second semiconductor layer,
the vicinity region includes the portion of the interface, and
the vicinity region is included in the containing region.

16. The field-effect transistor according to claim 1, wherein a concentration of the first impurities of the second region in the second semiconductor layer is substantially equal to zero.

17. The field-effect transistor according to claim 1, wherein the containing region has higher resistance than the non-containing region due to introduction of the first impurities.

18. A field-effect transistor comprising:
a substrate;
a first semiconductor layer including a plurality of semiconductor layers stacked on the substrate, and including a channel;
a source electrode and a drain electrode which are disposed directly on the first semiconductor layer;
a gate electrode; and
a second semiconductor layer disposed directly on the first semiconductor layer and below the gate electrode, the second semiconductor layer having a conductivity type opposite to a conductivity type of the channel, wherein:
the first semiconductor layer includes a containing region which contains first impurities and a non-containing region which does not contain the first impurities,
the containing region has higher resistance than the non-containing region due to introduction of the first impurities, and
the second semiconductor layer is disposed on the containing region of the first semiconductor layer in a stacking direction of the substrate, the first semiconductor layer and the second semiconductor layer.

19. The field-effect transistor according to claim 18, a concentration of the first impurities of a portion of the second semiconductor layer located directly above the containing region is lower than a concentration of the first impurities of the containing region.

* * * * *